United States Patent [19]

Tiritilli

[11] Patent Number: 4,769,083
[45] Date of Patent: Sep. 6, 1988

[54] METHOD FOR REMOVING EXCESS SOLDER FROM PRINTED CIRCUIT BOARDS

[75] Inventor: Leonard A. Tiritilli, Arcadia, Calif.

[73] Assignee: Gould Inc., Rolling Meadows, Ill.

[21] Appl. No.: 822,562

[22] Filed: Jan. 27, 1986

[51] Int. Cl.[4] .............................................. B08B 7/00
[52] U.S. Cl. ...................................... 134/6; 134/25.4; 134/34; 134/35; 134/40; 15/21 R; 15/102; 228/19; 228/37; 228/40; 51/320
[58] Field of Search ............... 134/10, 11, 25.1, 25.4, 134/34, 35, 40; 228/19, 37, 40; 51/320, 319; 15/21 R, 102 R, 15 C, 77

[56] References Cited

U.S. PATENT DOCUMENTS

| | | | |
|---|---|---|---|
| 2,671,264 | 3/1954 | Pessel | 118/58 |
| 3,266,136 | 8/1966 | Gutbier | 29/471.1 |
| 3,482,755 | 12/1969 | Raciti | 228/34 |
| 3,553,824 | 1/1971 | Kozhicky | 29/487 |
| 3,583,063 | 6/1971 | Growney | 118/58 |
| 3,604,609 | 9/1971 | Walls | 228/19 |
| 3,604,610 | 9/1971 | Fortune | 228/20 |
| 3,795,358 | 3/1974 | Sarnacki et al. | 228/19 |
| 4,113,165 | 9/1978 | Ott | 228/37 |
| 4,325,780 | 4/1982 | Schultz, Sr. | 156/659.1 |
| 4,334,646 | 6/1982 | Campbell | 222/180 A |
| 4,412,641 | 11/1983 | Fuchs et al. | 228/37 |
| 4,541,358 | 9/1985 | Spigarelli et al. | 118/58 |
| 4,555,302 | 11/1985 | Urbanik | 134/34 |
| 4,589,926 | 5/1986 | Holmstrand | 134/30 |

Primary Examiner—H. M. S. Sneed
Assistant Examiner—Sharon T. Cohen
Attorney, Agent, or Firm—Robert J. Fox; G. Paul Edgell; Edward E. Sachs

[57] ABSTRACT

A method for removing excess solder from a printed circuit board is practiced by mixing a quantity of ceramic beads with an oil to form a fluidized bed mixture. The fluidized bed mixture is heated to a temperature above the melting point of a solder on the printed circuit board. A surface of the printed circuit board to be cleaned is placed in contact with the heated fluidized bed and agitated against the bed to remove excess solder.

13 Claims, 3 Drawing Sheets

METHOD FOR REMOVING EXCESS SOLDER FROM PRINTED CIRCUIT BOARDS

BACKGROUND OF THE INVENTION

The invention generally relates to a method fluidized bed process for melting and brushing away excess solder and solder spikes from a printed circuit board.

Electronic circuit assemblies are often constructed by joining a number of integrated circuits and discrete components such as resistors, capacitors, inductors and the like to a printed circuit board having a plurality of conductive metal traces thereon. The printed circuit board is usually first fabricated by etching away portions of a metal or foil layer to define the conductive metal traces. After etching holes are drilled in the board to accept leads from the components to be connected thereto. Typically the components are placed on the board manually or by automatic insertion equipment. Following placement of the components, the printed circuit board is loaded into a conventional wave soldering machine wherein a pulse or wave of melted solder is brought into contact with the bottom side of the board opposite the side having components on it, so that solder is drawn up the leads and into contact with the conductive foil traces at the points where the leads enter the board in order to effect good electrical connections between the leads and associated conductive traces.

In some instances, however, the wave soldering machine also leaves solder spikes behind on the printed circuit board and excess solder on the conductive traces. The solder spikes and excess solder can cause inadvertent conductive bridges to be formed between various circuit elements which can cause the circuit performance to deteriorate or lead to outright circuit failure. One method previously employed for removing solder spikes from printed circuit boards has been to desolder manually portions of the board either using heated copper braid to draw the solder off by capillary action or vacuum equipment. These prior methods, however, are time consuming, often taking fifteen minutes for a single board, and expensive.

Another method for removing unwanted solder from a printed circuit board consists of immersing an entire printed circuit board in heated oil and spinning it rapidly to throw melted solder off the board. Clearly this is not a desirable process to be carried out if delicate components have already been attached to the board which would be damaged by immersion in the heated oil. Furthermore, complex machinery is required to spin the board while it is submerged in the heated oil.

U.S. Pat. No. 3,553,824 to Kozelnicky for PROCESS FOR ELIMINATING ICICLE-LIKE FORMATIONS ON SOLDERED CIRCUIT SUBSTRATES is directed to a process whereby, after wave soldering, a printed circuit board having icicle or spike-like formations of solder extending therefrom is inverted so that the solder spikes are extending upward. The fluxed soldered surface is then exposed to an infrared or radiant heat source providing sufficient heat energy to melt the solder spikes. The force of gravity pulls the softened or melted spikes down.

Another prior art approach to removing solder spikes from circuit boards is disclosed in U.S. Pat. No. 3,604,609 to Walls for APPARATUS FOR ELIMINATING ICICLE-LIKE FORMATIONS ON WAVE-SOLDERED CONNECTIONS ON CIRCUIT SUBSTRATES. That system is also directed to solving the problem of solder spike formation which accompanies the use of wave soldering machinery used to solder printed circuit boards. Walls teaches the use of a taut fine wire oriented parallel to a solder wave and immediately following it so that the wire, which is warmed above room temperature, scrapes off all of the solder spikes extending more than a pre-selected distance below the surface of the printed circuit board being soldered.

Both of these prior art processes suffer from several drawbacks. Kozelnicky does not remove any of the excess solder from the board, but rather causes it to slump down onto the surface of the board where it may spread out and form additional bridges. In addition, if solder bridges have been formed between adjacent contacts, the slumping action produced by the Kozelnicky process will not necessarily break the solder bridges. Therefore, the Kozelnicky process may leave unintentional shorts on the board. Excess solder which lies on the conductive foil traces can also form bridges. It, likewise, will not be removed by the Kozelnicky process since the solder will merely spread on the conductive traces.

The Walls process suffers from similar defects in that only a portion of a solder spike will be removed, that portion extending below the level of the scraping wire. Bridges between successive solder spikes will not be removed if the bridges are located closer to the board than the wire. It is clear that there must be some clearance between the scraping wire and the board to avoid having the scraping wire catch on the ends of leads extending below the board. Excess solder lying on the conductive foil traces on the bottom of the board will not be removed by the Walls process since the scraping wire cannot be brought into contact with it.

Therefore, the prior art suffers from the defects that the prior methods of cleaning printed circuit boards do not effectively remove all solder bridges or excess solder lying on the printed circuit board traces.

What is needed is a method for quickly and conveniently removing solder spikes and excess solder from a surface of a printed circuit board opposite the surface upon which the components are mounted. The removal process should be compatible with the board fabrication processes in that it should not cause damage to the components on the board.

SUMMARY OF THE INVENTION

A method for removing excess solder and solder spikes from printed circuit boards is herein disclosed. The method and apparatus include the provision of an electric heater which supports a metal tank thereon and to which it supplies heat. The metal tank is filled with a layer of glass beads to which is added a quantity of fusing oil. The fusing oil and glass beads comprise a fluidized bed which is heated to 525° F. by the electric heater.

A fixture comprising a pair of clamping elements receives a printed circuit board having a plurality of conductive foil traces thereon. The fixture is used for bringing the printed circuit board into contact with the heated fluidized bed. The printed circuit board typically has excess solder on its conductive foil traces and also solder bridges or solder spikes formed thereon which are to be removed.

The printed circuit board is lowered into contact with the fluidized bed which melts the solder. The printed circuit is moved back and forth in contact with the fluidized bed to scrub the excess solder from the bottom of the printed circuit board. The printed circuit board need only stay in contact with the fluidized bed for 20 or 30 seconds in order to remove all of the excess solder without removing the solder required to effect good electrical connection between the components and the conductive foil traces on the printed circuit board.

It is a principal object of the present invention to provide a method of removing excess solder from printed circuit boards which removes substantially all of the excess solder, including solder bridges, solder spikes and excess solder on conductive foil traces of the printed circuit boards.

It is another object of the present invention to provide a method for removing excess solder from printed circuit boards which does not damage the printed circuit boards or electronic components thereon.

It is a still further object of the present invention to provide a method for removing excess solder from printed circuit boards which does not remove solder required to make good electrical connections between electronic components affixed to the printed circuit board and conductive foil traces on the printed circuit board Other objects and uses of the present invention will be come obvious to one skilled in the art upon a perusal of the following specification and claims in light of the accompanying drawings.

DESCRIPTION OF THE PREFERRED EMBODIMENTS

Figure 1:
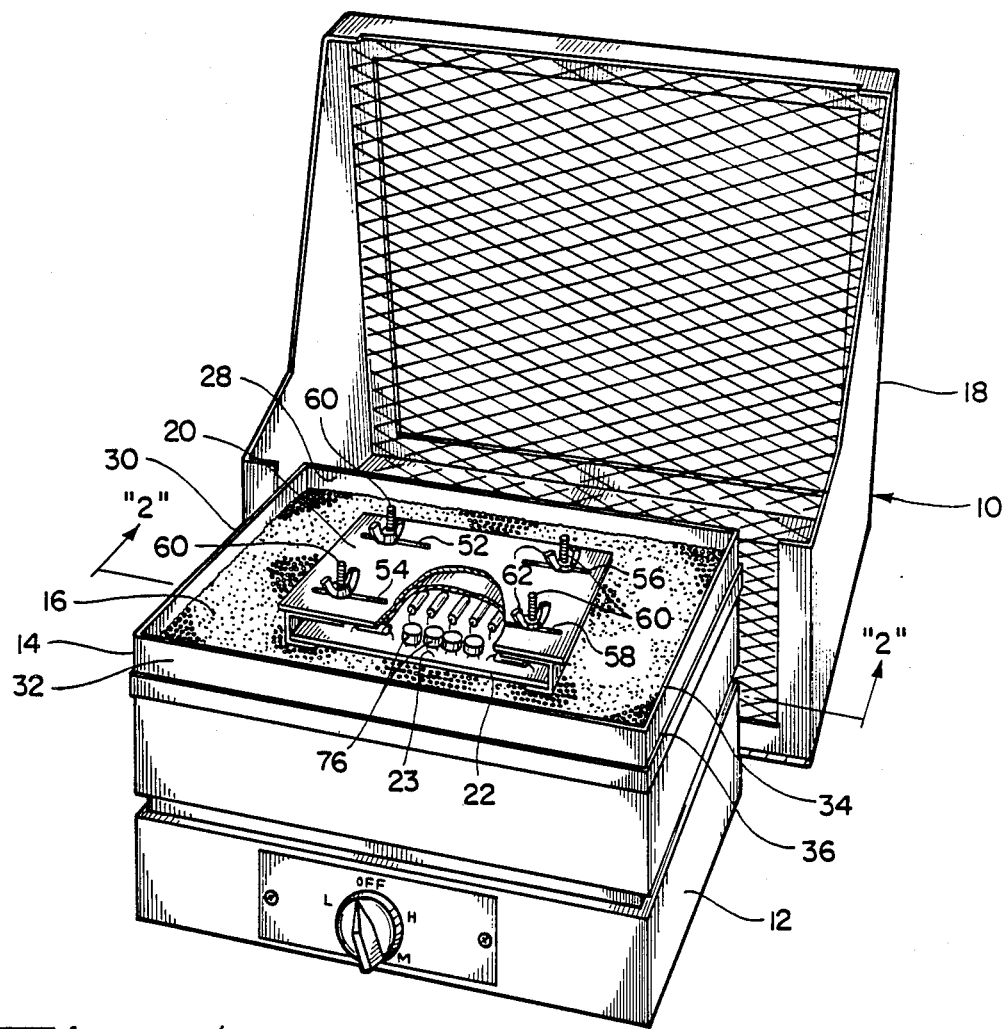
FIG. 1 is a perspective view of an apparatus for carrying out the solder removal process of the present invention including a heater, a tank, containing therein a fluidized bed and a fixture having portions broken away to show details of a printed circuit board in contact with the fluidized bed.

Referring now to the drawings and especially to FIG. 1, an apparatus for removing excess solder from printed circuit boards generally indicated by numeral 10 and embodying the present invention is shown therein. The solder removal apparatus 10 includes an electric heater 12 and a shallow metal tank 14 resting in good heat conduction relationship atop the electric heater 12 and containing a fluidized bed 16. A hinged cover 18 is connected to the electric heater 12. A fixture 20, holding a printed circuit board 22 having a top or component side 23 and a bottom or foil side 24 which is to be cleaned, rests in the shallow metal tank 14 on the fluidized bed 16.

The electric heater 12 is a conventional electric heater, for instance, a Thermolyne type 2600 hotplate or other suitable electric resistance heater. The shallow metal tank 14 is a rectangular sheet metal tank comprised of a bottom wall 26 formed integral with a plurality of right angle side walls 28, 30, 32 and 34. In the instant embodiment the side walls 28, 30, 32 and 34 are relatively short wide walls, thereby defining the shallow tank 14. The bottom wall 26 of the shallow metal tank 14 is in contact with a surface 36 of the upper portion of the hotplate 12 and receives thermal energy therefrom.

The fluidized bed 16 consists of a plurality of glass beads 38 having a mean diameter of about 0.060 inches. A quantity of fusing oil 40 is added to the glass beads 38 in an amount just sufficient to cover the upper surface of the glass beads 38. The fluidized bed 16 made up of the glass beads 38 and the fusing oil 40, in the instant embodiment is approximately 0.5 inches in depth. The fluidized bed 16 is heated to a temperature about 525° F. by the electric heater 12.

In order to support the printed circuit board 22 in contact with the fluidized bed 16 for cleaning thereby, the fixture 20 has been provided. The fixture 20 consists of a baseplate 50 which is generally rectangular and composed of sheet metal having four elongated slots 52, 54, 56, and 58 formed therein. Each of the slots 52, 54, 56 and 58 receives a carriage bolt 60, a wingnut 62 threadedly connected to the carriage bolt 60 and a locknut 63. The locknut 63 engages a flange 64 which is used to hold the printed circuit board 22 in engagement with the fixture 20. The flange 64 consists of an outer flange wall 66, an integral top wall 68 and an integral bottom wall 70. The printed circuit board 22 is clamped between the bottom wall 70 of the flange 64 and a fiberglass plate 74. The fiberglass plate 74 is biased into contact with a plurality of electronic components 76 on the top side 23 of the printed circuit board 22 by the heads of the carriage bolts 60 in order to prevent the electronic components 76 from being detached from the printed circuit board 22 when the solder is heated by the fluidized bed 16.

Figure 2:
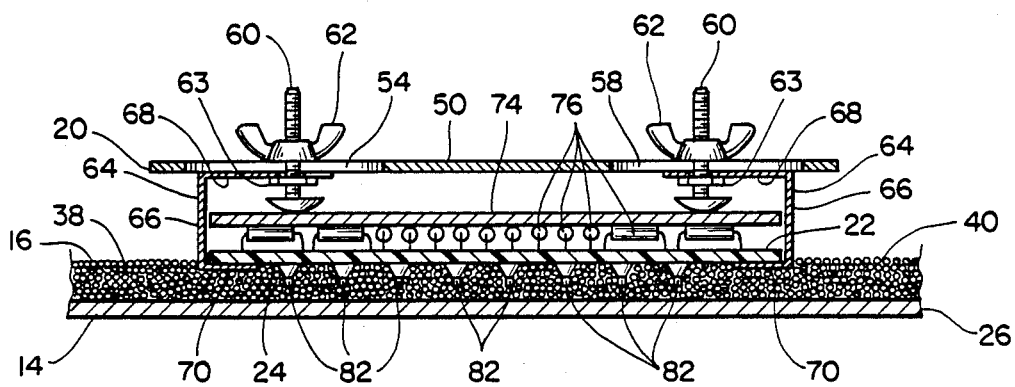
FIG. 2 is a section taken substantially along line 2—2 of FIG. 1 and having portions broken away to show details of the engagement of a bottom side of the printed circuit board with the fluidized bed.
Figure 3:
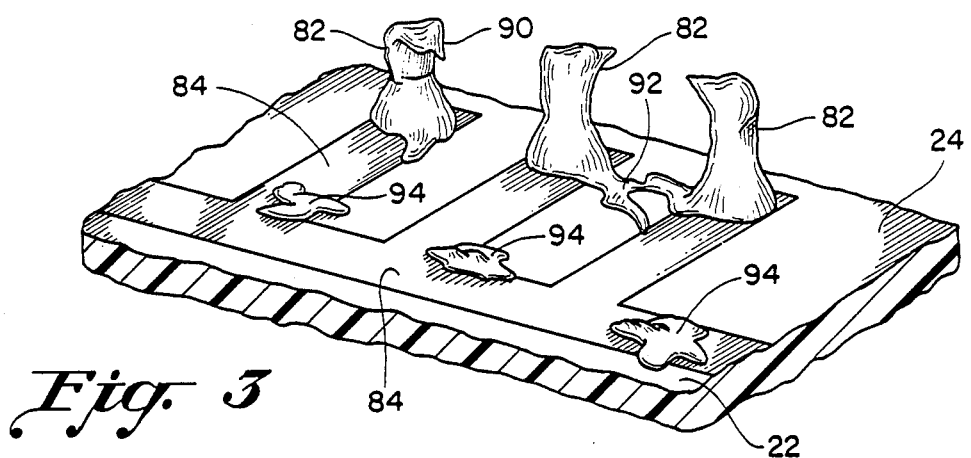
FIG. 3 is a perspective view of a portion of the printed circuit board of FIGS. 1 and 2 showing details of excess solder forming solder spikes, solder bridges and excess solder on a plurality of conductive foil traces of the printed circuit board.
Figure 4:
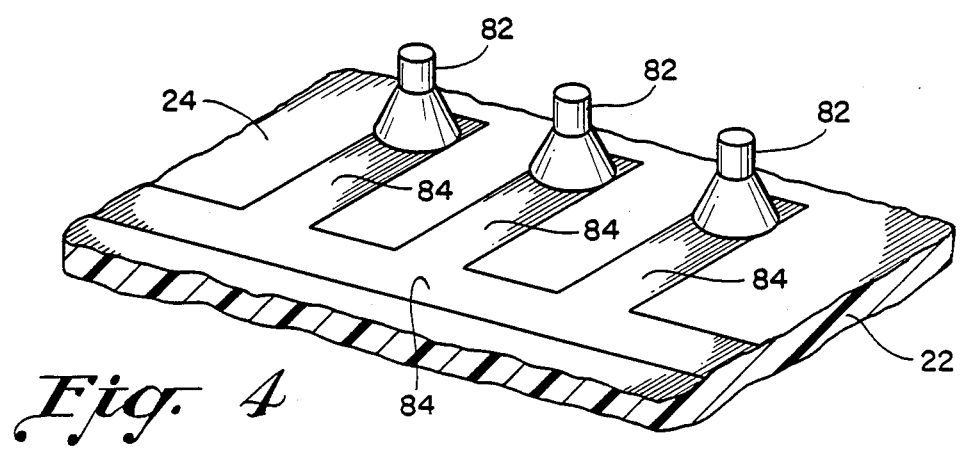
FIG. 4 is a view similar to FIG. 3 showing the condition of the printed circuit board of FIG. 3 following use of the process and apparatus for removing excess solder which comprises the present invention.
Figure 5:
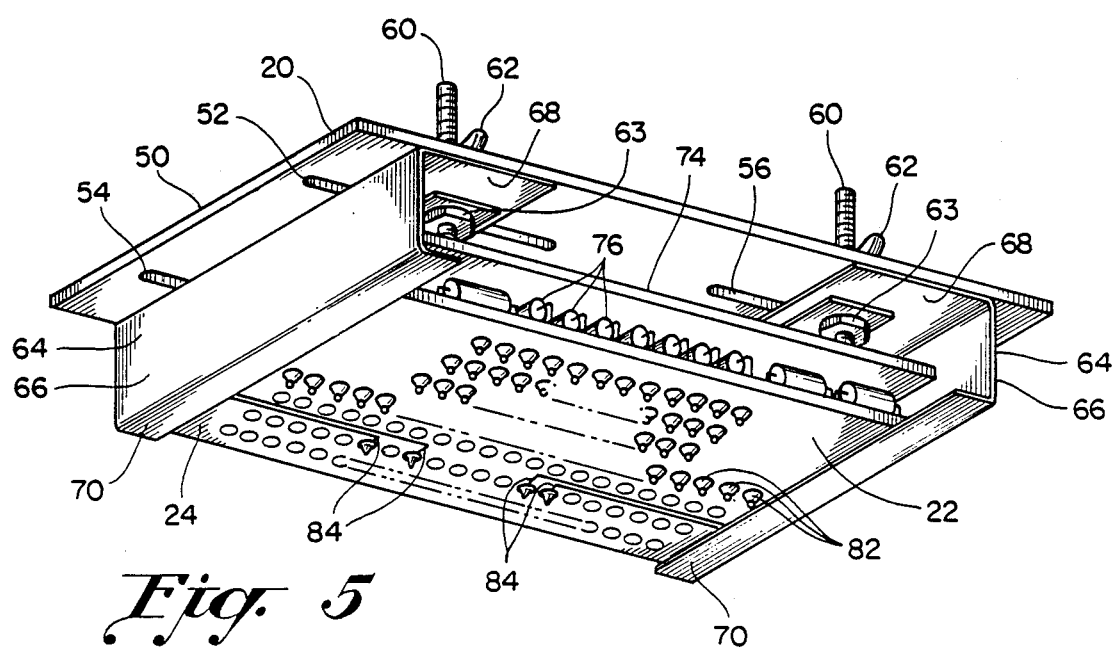
FIG. 5 is a perspective view of the printed circuit board clamped in a fixture before the fixture and board assembly is brought into contact with the heated fluidized bed.

In operation, the printed circuit board 22 is clamped between the flanges 64 with its bottom side 24 being exposed. The bottom side 24 has exposed thereon a plurality of lead ends 82 and a plurality of conductive metal or foil traces 84. The electric heater 12 heats the fluidized bed 16 to a temperature of 525° F. The fixture 20 having the printed circuit board 22 thereon is lowered into contact with the fluidized bed 16, as may best be seen in FIGS. 1 and 2. The fixture 20 is then moved back and forth on the fluidized bed 16 thereby causing excess solder of the type shown in FIG. 3 to be scrubbed off the bottom side 24 of the printed circuit board 22. More particularly, the excess solder of the type shown in FIG. 3 includes a plurality of solder spikes 90, a plurality of solder bridges 92, and excess solder 94 on the conductive foil traces 84. Subsequent to scrubbing for approximately 20 to 30 seconds in the heated fluidized bed 16, the printed circuit board 22 is removed and all of the excess solder has been removed from the bottom side 24, as may best be seen in FIG. 4.

Due to the relatively small amount of fusing oil 40 which is employed in the fluidized bed 16, the glass beads 38 are maintained in a relatively close packing relationship which gives the fluidized bed 38 a consistency similar to that of beach sand. Thus, when the bottom side 24 of the printed circuit board 22 is lowered into contact with the fluidized bed 16 the printed circuit board 22 does not displace the fluidized bed 16 sideways of sink into the fluidized bed 16 to any significant depth. Therefore the fluidized bed 16 does not cover the upper side of the printed circuit board 22 having the electronic components 76 thereon and the electronic components 76 are protected from the effects of the fluidized bed 16.

Provision is made to protect an operator of the apparatus 10 of the instant invention in that the cover 18 may be swung down to cover the fluidized bed 16 while it remains heated. Thus, it is unnecessary to turn off the power heating the fluidized bed 16 when it is not in use.

Although in the preferred embodiment fusing oil is employed as the fluid material 40 of the fluidized bed 16, other fluids may also be employed. Fluids such as peanut oil may also be employed to practice the instant invention. In addition, certain gases which have good heat conductive capacities such as hydrogen or hydrogen mixed with nitrogen may be used as the fluid portion of the fluidized bed 16 and may eliminate any cleaning steps which might be necessitated by the use of oil to remove the excess solder.

Figure 6:
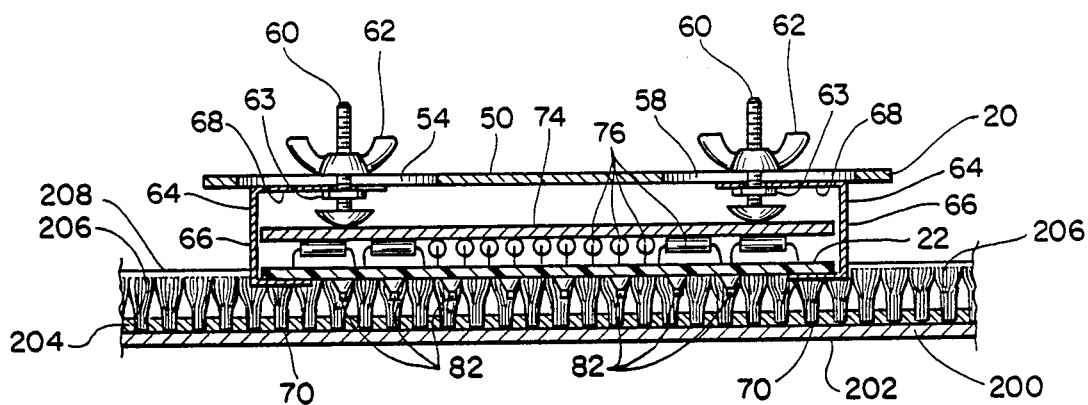
FIG. 6 is a section of an alternative embodiment of the present invention showing details of the engagement of a bottom side of a printed circuit board with heated fluid and a plurality of bristles.

In a alternative embodiment of the instant invention as may best be seen in FIG. 6, a tank 200 having a bottom metal wall 202 has an interior layer 204 having pluralities of bristles 206 affixed perpendicularly thereto. The bristles 206 are flexible and composed of suitable material such as glass fibers, mineral fibers, metal, high temperature plastic or the like. The tank 200 is filled with a layer of fusing oil 208 to a level just above the ends of the bristles 206. The fusing oil is heated to a temperature of 530° F. whereupon the fixture 50 having the circuit board 22 clamped therein is lowered into contact with the bristles 206 and the fusing oil 208 and moved with respect to the bristles 206 and the fusing oil 208 to scrub the excess solder off the foil traces 84 of the board 22 and from the lead ends 82.

It may be appreciated that the instant invention overcomes many of the problems associated with the prior art in that all of the excess solder is removed from the printed circuit board including excess solder comprising solder bridges and solder adhering to the conductive foil traces 84 of the printed circuit board 22 which is below the level of the lead ends 82.

While there has been illustrated and described a particular embodiment of the present invention, it will be appreciated that numerous changes and modifications will occur to those skilled in the art, and it is intended in the appended claims to cover all those changes and modifications which fall within the true spirit and scope of the present invention.

What is claimed is:

1. A method for removing excess solder from a previously soldered printed circuit board, comprising the steps of: heating a mixture of a fluid and a plurality of beads to a temperature of about 525° F.; contacting a surface of a previously soldered printed circuit board having excess solder thereon with said mixture to effect softening of a portion said excess solder; and moving said mixture with respect to said printed circuit board to effect flow of said mixture past said surface and to effect collisions of said particles with said surface to remove excess solder therefrom.

2. A method for removing excess solder from a previously soldered printed circuit board, as defined in claim 1, wherein said fluid comprises heated oil.

3. A method for removing excess solder from a previously soldered printed circuit board, comprising the steps of: heating a mixture of a fluid and a plurality of ceramic beads to a temperature of about 525° F.; contacting a surface of a previously soldered printed circuit board having excess solder thereon, with said mixture to effect softening of a portion of said excess solder; and moving said mixture with respect to said printed circuit board to effect flow of said mixture past said surface and to effect collisions of said ceramic beads with said surface to remove excess solder therefrom.

4. A method for removing excess solder from a previously soldered printed circuit board, as defined in claim 3, wherein said ceramic beads comprise glass beads of a substantially uniform size.

5. A method for removing excess solder from a previously soldered printed circuit board, as defined in claim 4, wherein said fluid comprises heated oil.

6. A method for removing excess solder from a previously soldered printed circuit board, comprising the steps of: heating a mixture of fusing oil and glass beads to a temperature above 500° F.; introducing a previously soldered printed circuit board having a pair of surfaces into contact with said heated mixture of fusing oil and glass beads so that one of said surfaces is in contact with said heated mixture of fusing oil and glass beads while the other of said surfaces is exposed to air, and agitating said heated mixture of fusing oil and glass beads against said immersed surface of said printed circuit board to remove excess solder therefrom.

7. A method for removing excess solder from a previously soldered circuit board, as defined in claim 6, wherein said fusing oil comprises a quantity of fusing oil sufficient to cover said glass beads to comprise a heated fluidized bed.

8. A method for removing excess solder from a previously soldered printed circuit board, comprising the steps of: heating a fluid and a plurality of bristles to a temperature of about 525° F.; contacting a surface of a previously soldered printed circuit board having excess solder thereon with said fluid and said plurality of bristles to effect softening of a portion of said solder; and moving said printed circuit board with respect to said fluid and said plurality of bristles to effect moving contact of said plurality of bristles with said surface to remove excess solder therefrom.

9. A method for removing excess solder from a previously soldered printed circuit board, as defined in claim 8, wherein said plurality of bristles comprises a plurality of glass fibers.

10. A method for removing excess solder from a previously soldered printed circuit board, as defined in claim 9, wherein said fluid comprises hot oil.

11. A method for removing excess solder from a previously soldered printed circuit board, comprising the steps of: heating oil and a plurality of bristles to a temperature of about 525° F.; contacting a surface of a previously soldered printed circuit board having excess solder thereon with said heated oil and said plurality of bristles to effect softening of a portion of said solder; and moving said printed circuit board with respect to said heated oil and said plurality of bristles to effect moving contact of said plurality of bristles with said surface to remove excess solder therefrom.

12. A method for removing excess solder from a previously soldered printed circuit board, comprising the steps of: heating a plurality of bristles immersed in fusing oil to a temperature above 500° F.; introducing a previously soldered printed circuit board having a pair of surfaces into contact with said heated fusing oil so that one of said surfaces is in contact with said plurality of bristles and heated fusing oil while the other of said surfaces is exposed to air; agitating said plurality of bristles and heated fusing oil against said immersed surface of said printed circuit board to remove excess solder from said printed circuit board.

13. A method for removing excess solder from a previously soldered printed circuit board, as defined in claim 12, wherein said heated fusing oil comprises a quantity of heated fusing oil sufficient to cover said plurality of bristles.

* * * * *